(12) United States Patent
Wheeler et al.

(10) Patent No.: US 6,640,329 B2
(45) Date of Patent: Oct. 28, 2003

(54) REAL-TIME CONNECTION ERROR CHECKING METHOD AND PROCESS

(75) Inventors: William R. Wheeler, Southborough, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/941,498

(22) Filed: Aug. 29, 2001

(65) Prior Publication Data

US 2003/0046644 A1 Mar. 6, 2003

(51) Int. Cl.⁷ .............................................. G06F 17/50
(52) U.S. Cl. .................................. 716/5; 716/1; 716/11
(58) Field of Search ........................................ 716/1–21

(56) References Cited

U.S. PATENT DOCUMENTS

| | | |
|---|---|---|
| 5,128,871 A | 7/1992 | Schmitz |
| 5,220,512 A | 6/1993 | Watkins et al. |
| 5,258,919 A | 11/1993 | Yamanouchi et al. |
| 5,506,788 A | 4/1996 | Cheng et al. |
| 5,513,119 A | 4/1996 | Moore et al. |
| 5,553,002 A | 9/1996 | Dangelo et al. |
| 5,629,857 A * | 5/1997 | Brennan ...................... 716/11 |
| 5,666,289 A | 9/1997 | Watkins |
| 5,828,581 A | 10/1998 | Matumura |
| 5,852,564 A | 12/1998 | King et al. |
| 5,889,677 A | 3/1999 | Yasuda et al. |
| 5,892,678 A | 4/1999 | Tokunoh et al. |
| 5,933,356 A | 8/1999 | Rostoker et al. |
| 5,963,724 A | 10/1999 | Mantooth et al. |
| 6,044,211 A | 3/2000 | Jain |
| 6,053,947 A | 4/2000 | Parson |
| 6,066,179 A | 5/2000 | Allan |
| 6,106,568 A | 8/2000 | Beausang et al. |
| 6,117,183 A | 9/2000 | Teranishi et al. |
| 6,120,549 A | 9/2000 | Goslin et al. |
| 6,132,109 A | 10/2000 | Gregory et al. |
| 6,135,647 A | 10/2000 | Balakrishnan et al. |
| 6,152,612 A | 11/2000 | Liao et al. |
| 6,205,573 B1 | 3/2001 | Hasegawa |
| 6,219,822 B1 | 4/2001 | Gristede et al. |
| 6,233,540 B1 | 5/2001 | Schaumont et al. |
| 6,233,723 B1 | 5/2001 | Pribetich |
| 6,236,956 B1 | 5/2001 | Mantooth et al. |
| 6,260,179 B1 | 7/2001 | Ohsawa et al. |
| 6,272,671 B1 | 8/2001 | Fakhry |
| 6,298,468 B1 | 10/2001 | Zhen |
| 6,311,309 B1 | 10/2001 | Southgate |
| 6,324,678 B1 | 11/2001 | Dangelo et al. |

(List continued on next page.)

OTHER PUBLICATIONS

Renoir—Mentor Graphics, www.mentor.com as of 1999.
Foley et al., "An Object Based Graphical User Interface for Power Systems", IEEE Transactions on Power Systems, vol. 8, No. 1, Feb. 1993, pp. 97–104.

(List continued on next page.)

*Primary Examiner*—Matthew Smith
*Assistant Examiner*—Magid Y Dimyan
(74) *Attorney, Agent, or Firm*—Fish & Richardson P.C.

(57) ABSTRACT

A method comprising monitoring a design environment to detect the addition of a circuitry component to a circuit being designed by a circuit designer. The method accesses a connection parameter definition file that specifies a set of connection parameters for that added circuitry component. The method compares the connection parameters defined in the connection parameter definition file with the actual connections of the added circuitry component. The method provides the circuit designer with feedback concerning the validity of the actual connections of the added circuitry component.

36 Claims, 5 Drawing Sheets

U.S. PATENT DOCUMENTS

| | | | |
|---|---|---|---|
| 6,366,874 B1 | 4/2002 | Lee et al. | |
| 6,378,115 B1 | 4/2002 | Sakurai | |
| 6,401,230 B1 | 6/2002 | Ahanessians et al. | |
| 6,449,762 B1 | 9/2002 | McElvain | |
| 6,457,164 B1 | 9/2002 | Hwang et al. | |
| 6,477,683 B1 | 11/2002 | Killian et al. | |
| 6,477,689 B1 | 11/2002 | Mandell et al. | |
| 6,480,985 B1 | 11/2002 | Reynolds et al. | |
| 6,487,698 B1 | 11/2002 | Andreev et al. | |
| 6,505,341 B1 | 1/2003 | Harris et al. | |
| 6,519,755 B1 | 2/2003 | Anderson | |
| 2001/0018758 A1 | 8/2001 | Tanaka et al. | |
| 2002/0023256 A1 | 2/2002 | Seawright | |
| 2002/0042904 A1 | 4/2002 | Ito et al. | |
| 2002/0046386 A1 * | 4/2002 | Skoll et al. | 716/1 |
| 2002/0049957 A1 | 4/2002 | Hosono et al. | |
| 2002/0166100 A1 * | 11/2002 | Meding | 716/5 |
| 2003/0005396 A1 | 1/2003 | Chen et al. | |
| 2003/0016206 A1 | 1/2003 | Taitel | |
| 2003/0016246 A1 | 1/2003 | Singh | |

OTHER PUBLICATIONS

Pedram et al., "Floorplanning with Pin assignment", 1990 IEEE International Conference on Computer–Aided Design, Nov. 11, 1990, pp. 98–101.

Renoir, HDL Design Datasheet, Mentor Graphics, 1–8, 1999.

Mentor Graphics Corporation, Renoir$^{TM}$ With HDL2Graphics$^{TM}$, pp. 1–6, 1998, Oregon.

Mentor Graphics Corporation, Renoir HDL Design Datasheet, pp. 1–2, 1999, Oregon.

Computer Design, "After Hard Knocks, Cycle–Based Stimulators Stand Their Ground". http://www.computer-design.com/Editorial/1996/10/ASIC/after.html, accessed on Aug. 23, 2001, pp. 1–5.

* cited by examiner

REAL-TIME CONNECTION ERROR CHECKING METHOD AND PROCESS

TECHNICAL FIELD

This invention relates to connection error checking which occurs during circuitry design.

BACKGROUND

Integrated circuits typically include various combinational elements (e.g., AND gates, OR gates, NAND gates, XOR gates, etc.) and state elements (e.g., latches, flip-flops, etc.) in their design. Each of these combinational and state elements are discrete elements that the engineer places into the circuit design.

As integrated circuit designs get increasingly complex, engineers need enhanced tools to aid them in the design process. The design process for a semiconductor chip can typically be broken down into subtasks (i.e., design, capture, documentation, compilation, and debug). One typical way to design a complex semiconductor chip would be to have an architecture team and an implementation team. An architecture team provides various models (i.e., a specification and a object-based (e.g., C++) model) of the design to the implementation team. The implementation team tests and simulates the circuit using various tools (e.g., Synopsis® VCS Verilog Simulator, etc.). Any resulting bugs/errors can be collected in a list that is used by the architecture team to modify the circuit design. The modified design can then be given back to the implementation team for further testing.

DETAILED DESCRIPTION

Figure 1:
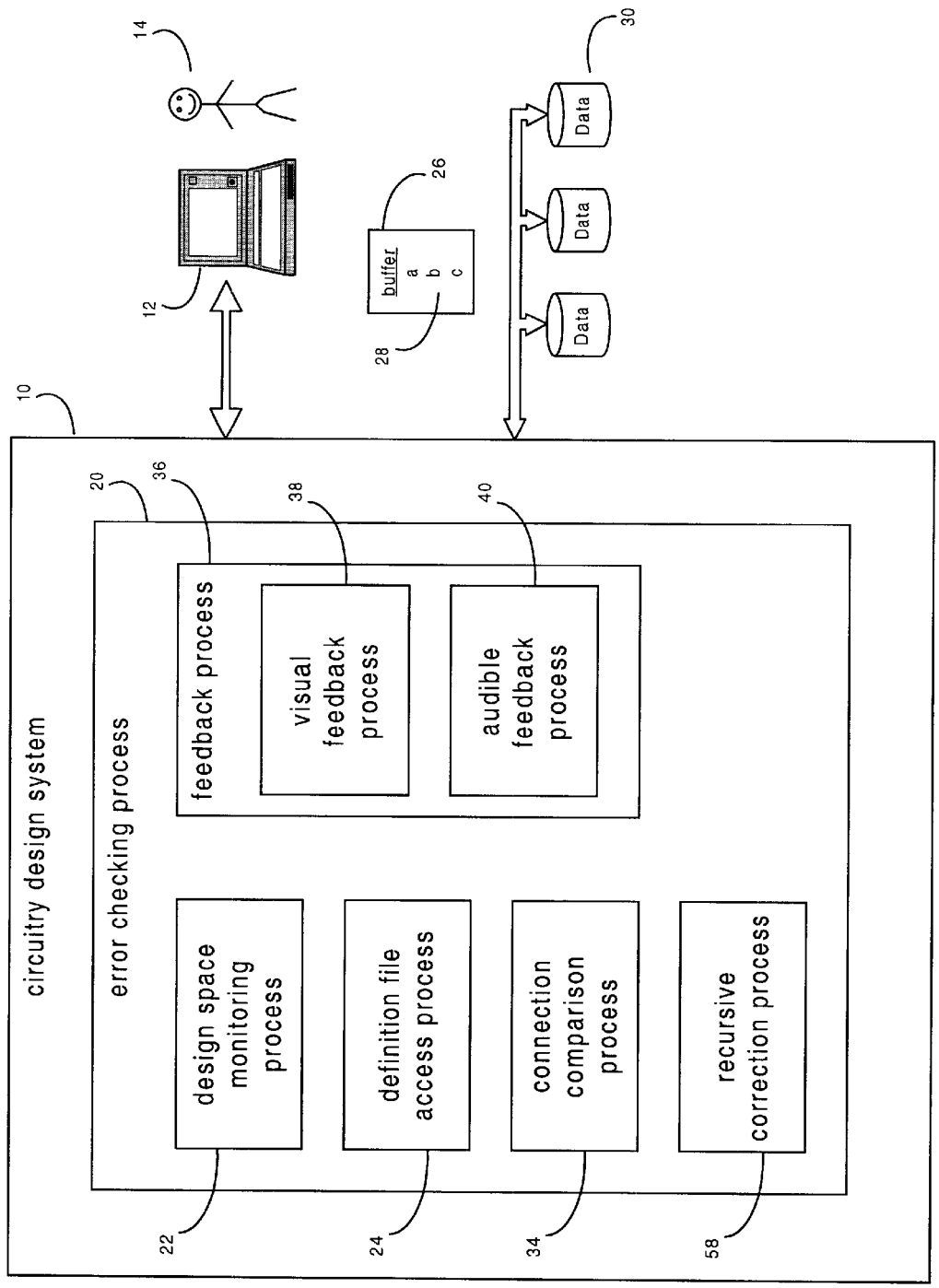
FIG. 1 is a diagrammatic view of the error checking process.
Figure 2:
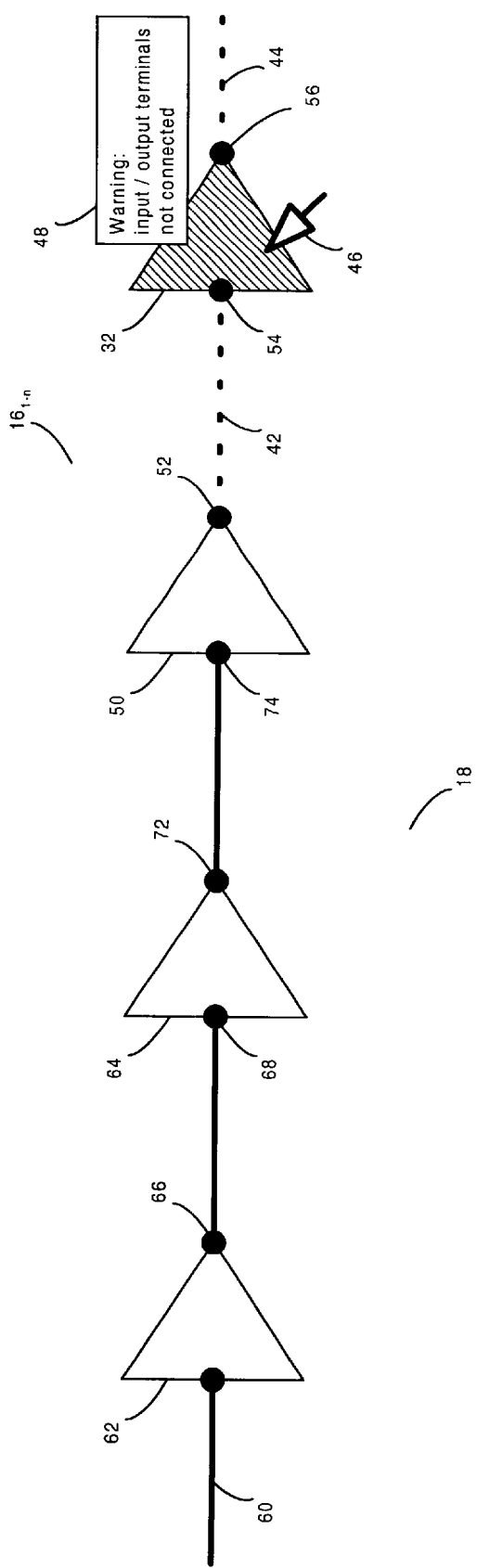
FIG. 2 is a diagrammatic view of the design space of the error checking process.

Referring to FIGS. 1 and 2, a circuitry design system 10 that operates on a computer system 12 (e.g., a laptop computer, desktop computer, mainframe/thin client, etc.) is shown. A circuit designer 14 (e.g., a hardware engineer, a software engineer, etc.) uses circuitry design system 10 to design electronic circuits that may be incorporated into semiconductor devices, mounted on printed circuit boards, etc.

The circuitry design system 10 is a graphical-based system. The designer 14 positions graphical representations of various circuitry components $16_{1-n}$ (e.g., AND gates, OR gates, NAND gates, XOR gates, latches, flip-flops, etc.) within a graphical representation of the circuit 18 being designed. During the design process, circuitry design system 10 provides contemporaneous feedback to designer 14 concerning the validity of the connections of each individual circuitry component $16_{1-n}$.

Circuitry design system 10 includes an error checking process 20 for providing the contemporaneous feedback to designer 14. Error checking process 20 includes a design space monitoring process 22 for monitoring circuitry design system 10 (i.e., a design environment) to detect the addition of a circuitry component $16_{1-n}$ to the circuit 18 being designed by designer 14.

When design space monitoring process 22 determines that a circuitry component $16_{1-n}$ has been added, a definition file access process 24 accesses a connection parameter definition file 26 for that circuitry component. This connection parameter definition file 26 specifies a set of connection parameters 28 for that particular type of circuitry component. Files 26 are stored on some form of data repository 30 (e.g., a hard drive, a database, etc.).

Each circuitry component $16_{1-n}$ added to circuit 18 is of a specific type (e.g., AND gate, OR gate, NAND gate, XOR gate, latch, flip-flop, etc.). When a component $16_{1-n}$ is added to circuit 18, a definition file access process 24 first determines the type of circuitry component and then accesses a connection parameter definition file 26 for that particular type of circuitry component. For example, if designer 14 adds a buffer 32 to circuit 18, design space monitoring process 22 would detect the addition of this buffer 32 to circuit 18. Definition file access process 24 analyzes this newly-added circuitry component 32 and determines that it is a buffer. Definition file access process 24 retrieves the connection parameter definition file 26 for this particular type of circuitry component (i.e., a buffer). The connection parameter definition file 26 for this buffer would include a set of connection parameters 28 specific for a buffer.

A connection comparison process 34 compares the connection parameters 28 specified in the connection parameter definition file 26 with the actual connections of the newly-added circuitry component 28 (i.e., the buffer).

Examples of these connection parameters 28 are a data path bitwidth, a terminal status parameter, a clocking connection parameter, etc. This list is not intended to be all inclusive and will vary depending on the type of device being added to the circuit being designed. Additionally, it is important to note that many of these parameters would actually be ranges of acceptable values, as opposed to a static number. For example, a buffer can have a varying data path bitwidth. Therefore, this data path bitwidth parameter might be a range from one bit to thirty-two bits. Further, these parameters might be rules such as: the requirement that the input bit width match the output bit width; the requirement that certain terminals of a circuitry component be connected to the circuit being designed, as the circuitry component would not function unless these terminals are connected; etc. For example, an AND gate contains at least two input terminals and an output terminal. A requirement for this AND gate could be that all three of the terminals are connected in the circuit being designed, as this AND gate would not function in the circuit unless all three of the connections are made.

Typically, when a circuitry component $16_{1-n}$ is added to circuit 18, the circuit component will be in some form of native color (typically gray). However, as soon as this circuitry component is dragged into position by designer 14, connection comparison process 34 will compare the parameters 28 specified in that circuitry component's connection parameter definition file 26 with the actual connections of that circuitry component. Since, at this time, this circuitry component is not yet connected to the circuit being designed, designer 14 will be provided with feedback indicating that this component still needs to be connected to circuit 18.

Error checking process 20 includes a feedback process 36 for providing this feedback to designer 14. Feedback process 36 includes a visual feedback process 38 for providing visual feedback (e.g., a component color change) to designer 14. Additionally, feedback process 36 may include a audible feedback process 40 for providing audible feedback (e.g., a beep) to designer 14.

The functionality of feedback process 36 is best described by continuing the above-stated example of adding buffer 32 to circuit 18. The connection comparison process 34 reviews the connection parameter definition file 26 for that type of circuitry component (i.e., a buffer). The connection comparison process 34 would determine (among other things) that the input and output terminals of the buffer 32 need to be connected to the circuit in order for the buffer to function properly.

Accordingly, feedback process 36 provides feedback to designer 14 to remind the designer that buffer 32 is not connected to circuit 18 and that all of its terminals are floating (i.e., in a high impedance state). Visual feedback process 38 will change the color of buffer 32 from its native color to a different color (typically red) indicating that one or more of the connections between buffer 32 and circuit 18 are invalid. This color change is depicted in FIG. 2 by diagonal hash marks. The color that indicates connection errors may be definable by designer 14. Additionally, as stated above, some form of audible feedback (e.g., a beep) may be provided to designer 14.

At this point in time, designer 14 will typically start connecting buffer 32 to circuit 18 by adding the necessary connections 42 and 44 (shown in phantom). As buffer 32 is connected to circuit 18 (assuming that there are no other connection problems), buffer 32 will typically change color to indicate that the connections between buffer 32 and circuit 18 are valid.

As it is foreseeable that designer 14 may not immediately realize the specific connection errors associated with buffer 32, visual feedback process 38 may also provide feedback in the form of a text box 48 that enumerates the connection problems associated with the circuitry component in question. For example, as stated above, prior to connecting buffer 32 to circuit 18, buffer 32 was red to indicate that there were connection problems associated with that buffer. If designer 14 did not immediately realize what these problems were, designer 14 can simply move their mouse pointer 46 over the component in question (i.e., the buffer) so that a text box 48 appears which provides information concerning the specific connection errors. Continuing with the above-stated example, text box 48 would provide a message such as "Warning: input/output terminals not connected", providing a hint to designer 14 concerning the nature of the connection problems associated with buffer 32.

Error checking process 20 is further configured to monitor the existing circuitry components included in a circuit to determine if they are modified in any way. In the event that they are modified, error checking process 20 reexamines the modified circuitry component to determine the validity of that modified circuitry component's connections to circuit 18.

Accordingly, the design space monitoring process 22 is configured to monitor the design environment to detect the modification of an existing circuitry component. In the event that an existing circuitry component is modified, definition file access process 24 accesses the connection parameter definition file 26 associated with that modified circuitry component. Connection comparison process 34 compares the connection parameters 28 specified in the connection parameter definition file 26 with the actual connection of the modified circuitry component. In the event that there are connection errors between this modified circuitry component and the circuit, feedback process 36 provides feedback to designer 14 concerning these errors.

This reexamination process allows error checking process 20 to provide designer 14 with an accurate indicator of a circuitry component's connection validity regardless of modifications made to that circuitry component after its initial placement into the circuit. The reexamination occurs regardless of whether the modification as made by designer 14 or error checking process 20.

Continuing with the above-stated example, once buffer 32 is connected to circuit 18 by connections 42 and 44, buffer 32 is no longer a newly installed component. Therefore, in the event that this circuitry component is subsequently modified, it must be reexamined in order to determine the validity of the connections between modified buffer 32 and circuit 18.

Continuing with the above-stated example, if a second buffer 50 in circuit 18 has a data path bitwidth of four bits and the newly-added buffer 32 has a default bitwidth of one bit, there will be a bitwidth mismatch between the output terminal 52 of buffer 50 and the input terminal 54 of buffer 32. Accordingly, buffer 32 will change color to red (or some other color), thus indicating a connection error between buffers 32 and 50. In the event that designer 14 does not immediately realize the data path bitwidth mismatch, text box 48 is available to designer 14 to provide the necessary hint. Once designer 14 corrects this data path bitwidth mismatch (i.e., changes the input and output terminals 54 and 56 of buffer 32 to four bit), buffer 32 will again change color to indicate that there are no connection errors between buffers 32 and 50.

Error checking process 20 further includes a recursive correction process 58 for automatically correcting connection errors which propagate through circuit 18. This recursive correction process 58 allows error checking process 20 to automatically correct any errors resulting from a single modification made by designer 14 (or an automated change made by error checking process 20) which ripple through circuit 18.

Recursive correction process 58 is best explained by continuing with the above-stated example. As stated above, the data path bitwidth of circuit 18 is four bits. If designer 14 realized that circuit 18 needed a sixteen bit wide data path, designer 14 would change the data path bitwidth of connection 60 to sixteen bits. This change, by designer 14, would result in a connection mismatch between buffers 62 and 64, as the output terminal 66 of buffer 62 is sixteen bits and the input terminal 68 of buffer 64 is four bits. In response to this change made by designer 14 (and the resulting connection error), recursive correction process 58 would automatically modify the input terminal 68 of buffer 64 to sixteen bits.

However, this change by recursive correction process 58 would now result in a connection mismatch between buffers 64 and 50, as the output terminal 72 of buffer 64 is now sixteen bits and the input terminal 74 of buffer 50 is four bits. This latest connection error is a result of the modification made by recursive correction process 58 to correct the previous connection error. In response to this connection error, recursive correction process 58 would automatically modify the input terminal 74 of buffer 50 to make it sixteen bits wide, thus correcting this data path bitwidth mismatch.

This recurring correction-error-correction process will continue as these errors (and the subsequent corrections) propagate through the circuit from left to right. This process will continue until all the required corrections are made.

By automatically correcting and compensating for these propagating and recurring connection errors, recursive correction process 58 minimizes the problems and complexities that occur when a designer 14 makes a simple change to a circuit that contains thousands of circuitry components.

Figure 3:
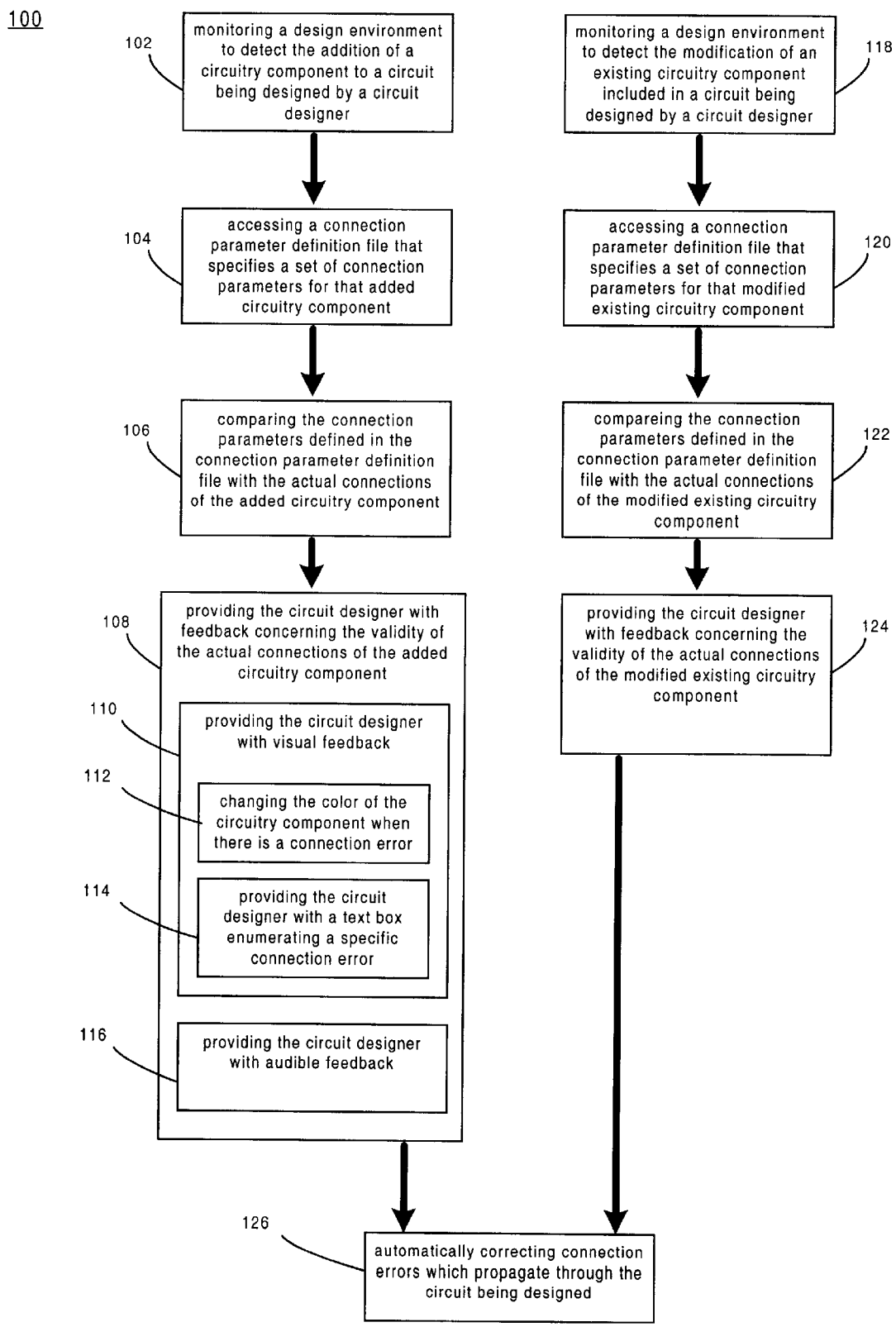
FIG. 3 is a diagrammatic view of the error checking method.

Referring to FIG. 3, an error checking method 100 that monitors 102 a design environment to detect the addition of a circuitry component to a circuit being designed by a circuit designer, and accesses 104 a connection parameter definition file that specifies a set of connection parameters for that added circuitry component. Method 100 compares 106 the connection parameters defined in the connection parameter definition file with the actual connections of the added circuitry component, and provides 108 the circuit designer with feedback concerning the validity of the actual connections of the added circuitry component.

Providing 108 the circuit designer with feedback includes providing 110 the circuit designer with visual feedback, such as: changing 112 the color of the circuitry component when there is a connection error; or providing 114 the circuit designer with a text box enumerating a specific connection error. Providing 108 the circuit designer with feedback includes providing 116 the circuit designer with audible feedback.

The set of connection parameters includes a data path bitwidth parameter, a terminal status parameter, or a clocking connection parameter.

Method 100 also monitors changes made to existing circuitry components. Accordingly, method 100 monitors 118 a design environment to detect the modification of an existing circuitry component included in a circuit being designed by a circuit designer, and accesses 120 a connection parameter definition file that specifies a set of connection parameters for that modified existing circuitry component. Method 100 compares 122 the connection parameters defined in the connection parameter definition file with the actual connections of the modified existing circuitry component, and provides 124 the circuit designer with feedback concerning the validity of the actual connections of the modified existing circuitry component.

Method 100 automatically corrects 126 connection errors which propagate through the circuit being designed.

Figure 4:
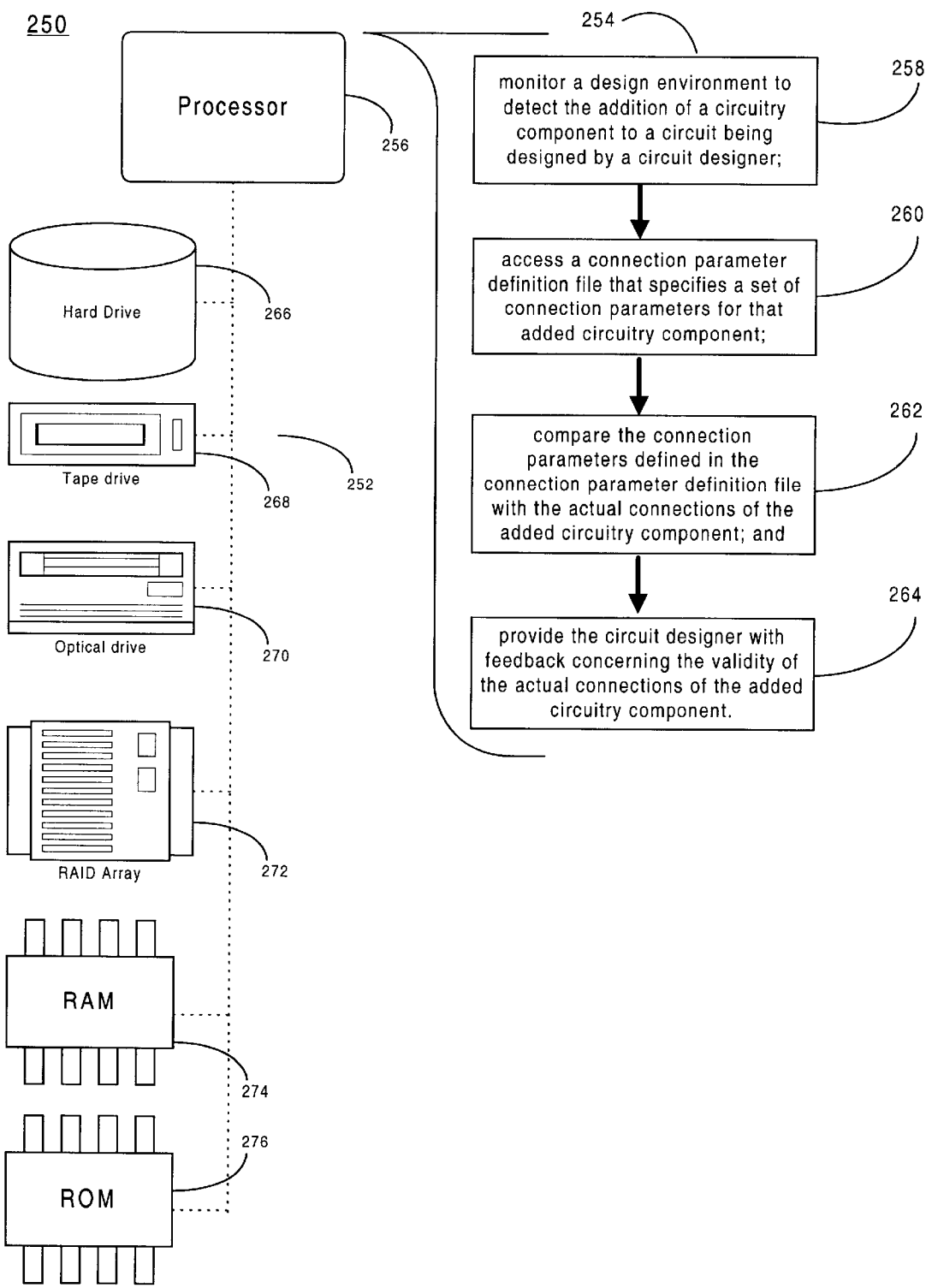
FIG. 4 is a diagrammatic view of another embodiment of the error checking process, including a processor and a computer readable medium.

Referring to FIG. 4, a computer program product 250 residing on a computer readable medium 252 having a plurality of instructions 254 stored thereon is shown. When executed by processor 256, instructions 254 cause processor 256 to monitor 258 a design environment to detect the addition of a circuitry component to a circuit being designed by a circuit designer. Computer program product 250 accesses 260 a connection parameter definition file that specifies a set of connection parameters for that added circuitry component. Computer program product 250 compares 262 the connection parameters defined in the connection parameter definition file with the actual connections of the added circuitry component. Computer program product 250 provides 264 the circuit designer with feedback concerning the validity of the actual connections of the added circuitry component.

Typical embodiments of computer readable medium 252 are: hard drive 266; tape drive 268; optical drive 270; RAID array 272; random access memory 274; and read only memory 276.

Figure 5:
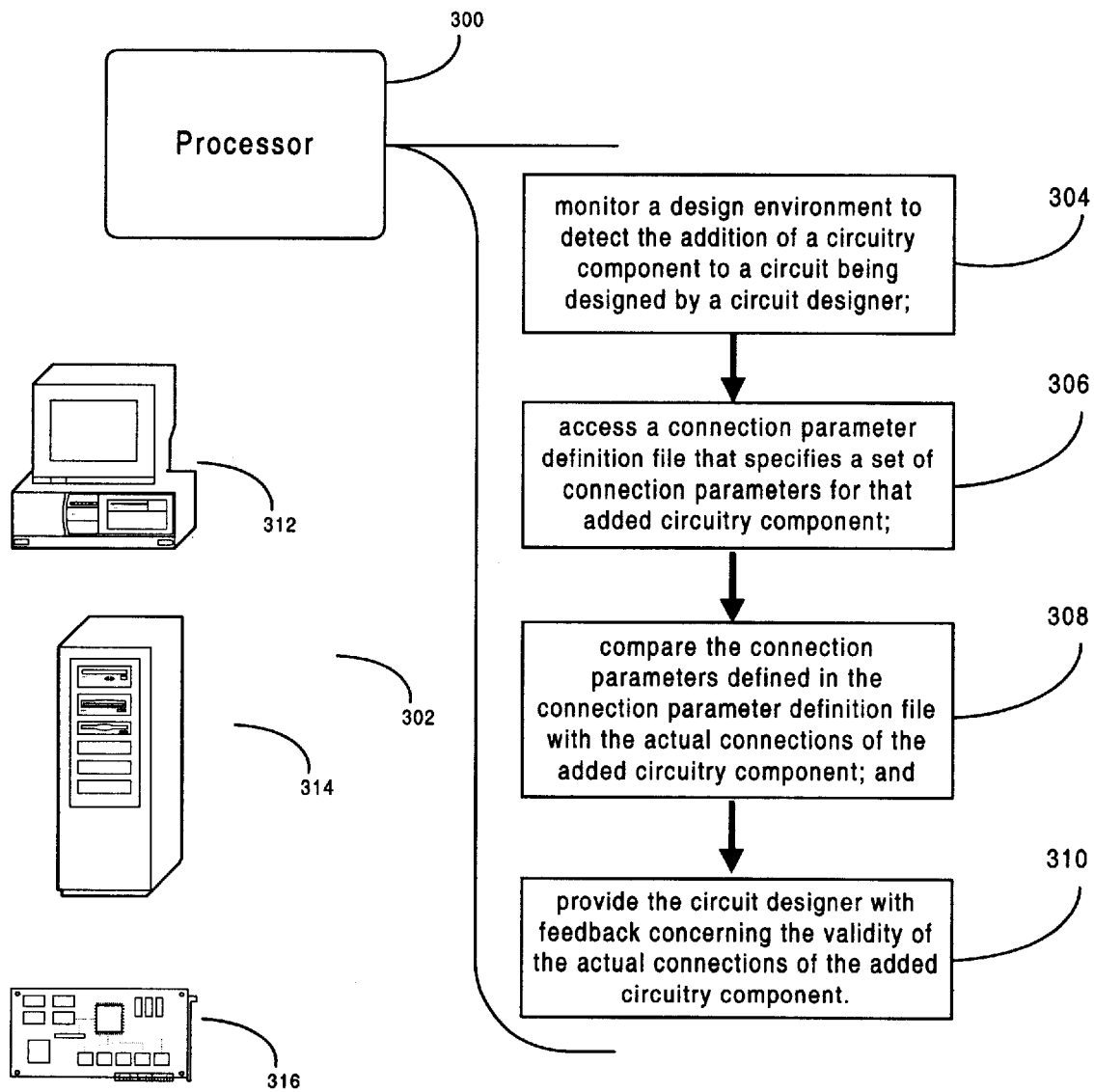
FIG. 5 is a diagrammatic view of another embodiment of the error checking process, including a processor and memory.

Now referring to FIG. 5, a processor 300 and memory 302 are configured to monitor 304 a design environment to detect the addition of a circuitry component to a circuit being designed. Processor 300 and memory 302 access 306 a connection parameter definition file that specifies a set of connection parameters for that added circuitry component. Processor 300 and memory 302 compare 308 the connection parameters defined in the connection parameter definition file with the actual connections of the added circuitry component. Processor 300 and memory 302 provide 310 the circuit designer with feedback concerning the validity of the actual connections of the added circuitry component.

Processor 300 and memory 302 may be incorporated into a personal computer 312, a network server 314, or a single board computer 316.

This technique avoid iterative, looping approaches that often result in production and time-to-market delays, lost profits, and increased design costs. This technique minimizes design errors prior to sending the specifications and models to an implementation team.

Other embodiments are within the scope of the following claims.

What is claimed is:

1. A method comprising:

monitoring a design environment to detect the addition of a circuitry component to a circuit being designed;

accessing a connection parameter definition file that specifies a set of connection parameters for that added circuitry component;

comparing the connection parameters defined in the connection parameter definition file with the actual connections of the added circuitry component; and providing feedback concerning the validity of the actual connections of the added circuitry component.

2. The method of claim 1 wherein said providing feedback includes providing a circuit designer with visual feedback.

3. The method of claim 2 wherein said providing the circuit designer with visual feedback includes changing the color of the circuitry component when there is a connection error.

4. The method of claim 2 wherein said providing the circuit designer with visual feedback includes providing the circuit designer with a text box enumerating a specific connection error.

5. The method of claim 1 wherein said providing feedback includes providing a circuit designer with audible feedback.

6. The method of claim 1 wherein said set of connection parameters includes a data path bitwidth parameter.

7. The method of claim 1 wherein said set of connection parameters includes a terminal status parameter.

8. The method of claim 1 wherein said set of connection parameters includes a clocking connection parameter.

9. The method of claim 1 further comprising:

monitoring a design environment to detect the modification of an existing circuitry component included in a circuit being designed by a circuit designer.

10. The method of claim 9 further comprising:

accessing a connection parameter definition file that specifies a set of connection parameters for that modified existing circuitry component.

11. The method of claim 10 further comprising:

comparing the connection parameters defined in the connection parameter definition file with the actual connections of the modified existing circuitry component.

12. The method of claim 11 further comprising:
providing the circuit designer with feedback concerning the validity of the actual connections of the modified existing circuitry component.

13. The method of claim 1 further comprising automatically correcting connection errors which propagate through the circuit being designed.

14. A method comprising:
monitoring a design environment to detect the modification of an existing circuitry component included in a circuit being designed by a circuit designer;
accessing a connection parameter definition file that specifies a set of connection parameters for that modified existing circuitry component;
comparing the connection parameters defined in the connection parameter definition file with the actual connections of the modified existing circuitry component; and
providing the circuit designer with feedback concerning the validity of the actual connections of the modified existing circuitry component.

15. The method of claim 14 wherein said providing the circuit designer with feedback includes providing the circuit designer with visual feedback.

16. The method of claim 14 further comprising automatically correcting connection errors which propagate through the circuit being designed.

17. An error checking process comprising:
a design space monitoring process for monitoring a design environment to detect the addition of a circuitry component to a circuit being designed by a circuit designer;
a definition file access process for accessing a connection parameter definition file that specifies a set of connection parameters for said added circuitry component;
a connection comparison process for comparing said connection parameters defined in said connection parameter definition file with the actual connections of said added circuitry component; and
a feedback process for providing the circuit designer with feedback concerning the validity of said actual connections of said added circuitry component.

18. The process of claim 17 wherein said feedback process includes a visual feedback process for providing the circuit designer with visual feedback.

19. The process of claim 18 wherein said visual feedback is changing the color of said circuitry component when there is a connection error.

20. The process of claim 19 wherein said visual feedback is a text box enumerating a specific connection error.

21. The process of claim 17 wherein said feedback process includes an audible feedback process for providing the circuit designer with audible feedback.

22. The process of claim 17 wherein said a design space monitoring process is configured to monitor a design environment to detect the modification of an existing circuitry component included in said circuit being designed by a circuit designer.

23. The process of claim 22 wherein said definition file access process is configured to access a connection parameter definition file that specifies a set of connection parameters for said modified existing circuitry component.

24. The process of claim 23 wherein said connection comparison process is configured to compare the connection parameters defined in said connection parameter definition file with the actual connections of said modified existing circuitry component.

25. The process of claim 24 wherein said feedback process is configured to provide the circuit designer with feedback concerning the validity of the actual connections of the modified existing circuitry component.

26. The process of claim 17 further comprising a recursive correction process which automatically corrects connection errors which propagate through said circuit being designed.

27. A computer program product residing on a computer readable medium having a plurality of instructions stored thereon which, when executed by the processor, cause that processor to:
monitor a design environment to detect the addition of a circuitry component to a circuit being designed by a circuit designer;
access a connection parameter definition file that specifies a set of connection parameters for that added circuitry component;
compare the connection parameters defined in the connection parameter definition file with the actual connections of the added circuitry component; and
provide the circuit designer with feedback concerning the validity of the actual connections of the added circuitry component.

28. The computer program product of claim 27 wherein said computer readable medium is a hard disk drive.

29. A processor and memory configured to:
monitor a design environment to detect the addition of a circuitry component to a circuit being designed by a circuit designer;
access a connection parameter definition file that specifies a set of connection parameters for that added circuitry component;
compare the connection parameters defined in the connection parameter definition file with the actual connections of the added circuitry component; and
provide the circuit designer with feedback concerning the validity of the actual connections of the added circuitry component.

30. The processor and memory of claim 29 wherein said processor and memory are incorporated into a personal computer.

31. A method comprising:
monitoring a design environment to detect the addition of a circuitry component to a circuit being designed;
accessing a connection parameter definition file that specifies a set of connection parameters, including a data path bitwidth parameter, for that added circuitry component;
comparing the connection parameters defined in the connection parameter definition file with the actual connections of the added circuitry component; and
providing feedback concerning the validity of the actual connections of the added circuitry component.

32. A method comprising:
monitoring a design environment to detect the addition of a circuitry component to a circuit being designed;
accessing a connection parameter definition file that specifies a set of connection parameters, including a terminal status parameter, for that added circuitry component;
comparing the connection parameters defined in the connection parameter definition file with the actual connections of the added circuitry component; and
providing feedback concerning the validity of the actual connections of the added circuitry component.

33. A method comprising:

monitoring a design environment to detect the addition of a circuitry component to a circuit being designed;

accessing a connection parameter definition file that specifies a set of connection parameters, including a clocking connection parameter, for that added circuitry component;

comparing the connection parameters defined in the connection parameter definition file with the actual connections of the added circuitry component; and providing feedback concerning the validity of the actual connections of the added circuitry component.

34. A method comprising:

monitoring a design environment to detect the addition of a circuitry component to a circuit being designed;

accessing a connection parameter definition file that specifies a set of connection parameters for that added circuitry component;

comparing the connection parameters defined in the connection parameter definition file with the actual connections of the added circuitry component;

providing feedback concerning the validity of the actual connections of the added circuitry component; and automatically correcting connection errors which propagate through the circuit being designed.

35. A method comprising:

monitoring a design environment to detect the modification of an existing circuitry component included in a circuit being designed by a circuit designer;

accessing a connection parameter definition file that specifies a set of connection parameters for that modified existing circuitry component;

comparing the connection parameters defined in the connection parameter definition file with the actual connections of the modified existing circuitry component;

providing the circuit designer with feedback concerning the validity of the actual connections of the modified existing circuitry component; and automatically correcting connection errors which propagate through the circuit being designed.

36. An error checking process comprising:

a design space monitoring process for monitoring a design environment to detect the addition of a circuitry component to a circuit being designed by a circuit designer;

a definition file access process for accessing a connection parameter definition file that specifies a set of connection parameters for said added circuitry component;

a connection comparison process for comparing said connection parameters defined in said connection parameter definition file with the actual connections of said added circuitry component;

a feedback process for providing the circuit designer with feedback concerning the validity of said actual connections of said added circuitry component; and a recursive correction process which automatically corrects connection errors which propagate through said circuit being designed.

* * * * *